(12) United States Patent
Chang et al.

(10) Patent No.: US 11,271,087 B2
(45) Date of Patent: Mar. 8, 2022

(54) METAL GATE PROCESS FOR FINFET DEVICE IMPROVEMENT

(71) Applicant: Taiwan Semiconductor Manufacturing Company, Ltd., Hsinchu (TW)

(72) Inventors: Che-Cheng Chang, New Taipai (TW); Chih-Han Lin, Hsinchu (TW); Horng-Huei Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/831,155

(22) Filed: Dec. 4, 2017

(65) Prior Publication Data

US 2018/0090590 A1    Mar. 29, 2018

Related U.S. Application Data

(63) Continuation of application No. 14/939,311, filed on Nov. 12, 2015, now Pat. No. 9,837,505.

(51) Int. Cl.
*H01L 21/3115* (2006.01)
*H01L 29/66* (2006.01)
*H01L 29/78* (2006.01)
*H01L 29/51* (2006.01)
(Continued)

(52) U.S. Cl.
CPC .......... *H01L 29/512* (2013.01); *H01L 21/265* (2013.01); *H01L 21/28114* (2013.01); *H01L 21/28123* (2013.01); *H01L 21/31155* (2013.01); *H01L 29/6653* (2013.01);
(Continued)

(58) Field of Classification Search
None
See application file for complete search history.

(56) References Cited

U.S. PATENT DOCUMENTS

| 7,176,092 B2 | 2/2007 | Yeo et al. |
| 7,745,270 B2 | 6/2010 | Shah et al. |
| 9,105,570 B2 | 8/2015 | Su et al. |

(Continued)

FOREIGN PATENT DOCUMENTS

| CN | 1716542 A | 1/2006 |
| CN | 103545176 A | 1/2014 |
| CN | 104347426 A | 2/2015 |

*Primary Examiner* — Zandra V Smith
*Assistant Examiner* — Lawrence C Tynes, Jr.
(74) *Attorney, Agent, or Firm* — Slater Matsil, LLP

(57) ABSTRACT

In a method for manufacturing a semiconductor device, a substrate is provided. A dummy gate is formed on the substrate. A first dielectric layer is formed to peripherally enclose the dummy gate over the substrate. A second dielectric layer is formed to peripherally enclose the first dielectric layer over the substrate. The second dielectric layer and the first dielectric layer are formed from different materials. An implant operation is performed on the first dielectric layer to form a first doped portion in the first dielectric layer. The dummy gate is removed to form a hole in the first dielectric layer. An operation of removing the dummy gate includes removing a portion of the first doped portion to form the hole having a bottom radial opening area and a top radial opening area which is greater than the bottom radial opening area. A metal gate is formed in the hole.

20 Claims, 7 Drawing Sheets

(51) Int. Cl.
*H01L 21/28* (2006.01)
*H01L 21/265* (2006.01)

(52) U.S. Cl.
CPC .. *H01L 29/66545* (2013.01); *H01L 29/66795* (2013.01); *H01L 29/785* (2013.01); *H01L 29/7851* (2013.01)

(56) References Cited

U.S. PATENT DOCUMENTS

| | | |
|---|---|---|
| 9,178,036 B1 | 11/2015 | Xie et al. |
| 9,257,348 B2 | 2/2016 | Xie et al. |
| 2006/0046401 A1* | 3/2006 | Kavalieros ...... H01L 21/823842 438/283 |
| 2012/0248510 A1 | 10/2012 | Hsu et al. |
| 2012/0248550 A1* | 10/2012 | Huang .............. H01L 29/66545 257/410 |
| 2013/0178024 A1 | 7/2013 | Flachowsky et al. |
| 2013/0228871 A1* | 9/2013 | Huang .............. H01L 29/66545 257/368 |
| 2014/0015104 A1* | 1/2014 | Su ........................ H01L 27/092 257/611 |
| 2014/0138745 A1 | 5/2014 | Shin et al. |
| 2014/0239393 A1* | 8/2014 | Kuo ................ H01L 21/823468 257/347 |
| 2014/0248778 A1 | 9/2014 | Moll et al. |
| 2015/0041905 A1 | 2/2015 | Xie et al. |
| 2015/0311081 A1 | 10/2015 | Xie et al. |
| 2015/0333148 A1 | 11/2015 | Koo et al. |

\* cited by examiner

METAL GATE PROCESS FOR FINFET DEVICE IMPROVEMENT

PRIORITY

This application claims the benefit to and is a continuation of U.S. patent application Ser. No. 14/939,311, filed on Nov. 12, 2015, and entitled "Metal Gate Process for FinFET Device Improvement" which application is incorporated herein by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A through FIG. 2J are schematic front views of intermediate stages showing a method for manufacturing a semiconductor device in accordance with various embodiments, in which FIG. 2A, FIG. 2B, FIG. 2D, FIG. 2F through FIG. 2J are viewed along an X-direction shown in FIG. 2A, and FIG. 2C and FIG. 2E are viewed along a Y-direction shown in FIG. 2A.

DETAILED DESCRIPTION

Figure 1:
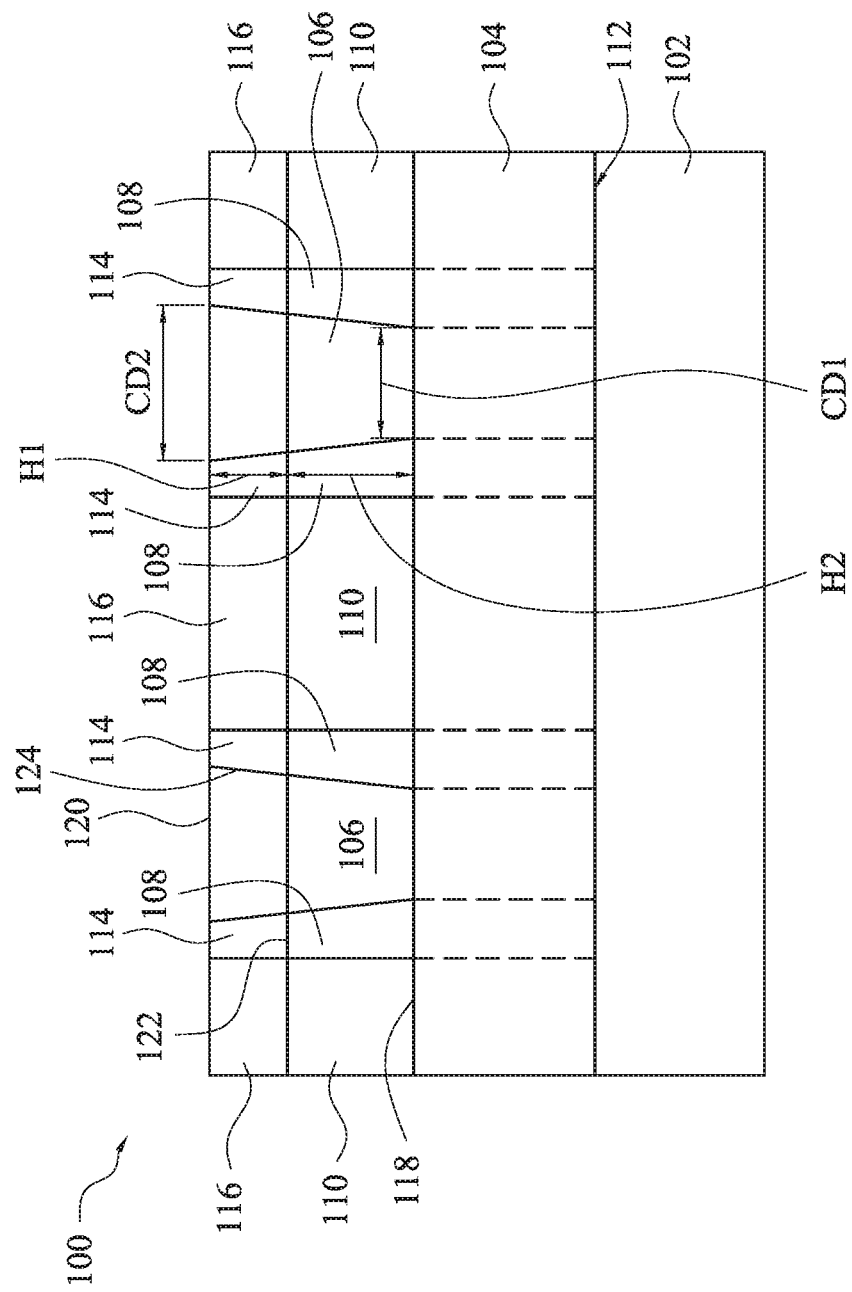
FIG. 1 is schematic front view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a FinFET device, a gate replacement process is performed to replace a polysilicon dummy gate with a metal gate. The performance of the FinFET device is significantly correlated with the profile of the metal gate. If the profile of the metal gate is unstable, the performance of the FinFET device is shifted. However, as the semiconductor IC industry has progressed into nanometer technology process nodes, a gate critical dimension is shrunk, and it is more difficult to fill a hole with a metal material for forming the metal gate by using a photolithography technique or a self-aligned double patterning (SADP) technique, in which the hole is formed by removing the polysilicon dummy gate.

Embodiments of the present disclosure are directed to providing a semiconductor device and a method for manufacturing the semiconductor device, in which before a dummy gate is removed, an implant operation is performed on a dielectric layer which peripherally encloses the dummy gate to form a doped portion in the dielectric layer. The doped portion has an etching selectivity with respect to the other portion of the dielectric layer during an operation of removing the dummy gate, in which a portion of the doped portion is removed during the operation of removing the dummy gate, such that an opening of a hole formed after the dummy gate is removed can be enlarged, thereby increasing filling efficiency of a metal gate material, thus enhancing performance of the semiconductor device.

FIG. 1 is schematic front view of a semiconductor device in accordance with various embodiments. In some embodiments, a semiconductor device 100 is a FinFET device. The semiconductor device 100 may include a substrate 102, at least one fin structure 104, at least one metal gate 106, at least one first dielectric layer 108 and at least one second dielectric layer 110. In some examples, the semiconductor device 100 includes one fin structure 104, metal gates 106, first dielectric layers 108 and second dielectric layers 110 disposed on the substrate 102. In certain examples, the semiconductor device 100 includes one fin structure 104, one metal gate 106, one first dielectric layer 108 and one second dielectric layer 110 disposed on the substrate 102.

The fin structure 104 is disposed on the substrate 102. In some examples, the fin structure 104 is formed by recessing the substrate 102, and thus the fin structure 104 protrudes from a recessed surface 112 of the substrate 102, in which the fin structure 104 and the substrate 102 are formed from the same material. The substrate 102 and the fin structure 104 may be composed of a single-crystalline semiconductor material or a compound semiconductor material. For example, silicon, germanium or glass may be used as a material of the substrate 102 and the fin structure 104. In some exemplary examples, the substrate 102 and the fin structure 104 are composed of silicon.

As shown in FIG. 1, each of the metal gates 106 is disposed on a portion of the fin structure 104 on the substrate 102. Each of the first dielectric layers 108 peripherally encloses one of the metal gates 106 over the surface 112 of the substrate 102 correspondingly. For example, the first dielectric layers 108 may be formed from silicon nitride or silicon oxynitride. In some examples, each of the first dielectric layers 108 includes a doped portion 114, in which the doped portion 114 extends from a top of the first dielectric layer 108. The doped portion 114 has an etching selectivity with respect to the first dielectric layer 108 during an operation of removing a dummy gate. In some exemplary examples, the doped portion 114 includes a dopant, such as phosphorous and boron.

Referring to FIG. 1 again, the second dielectric layers 110 peripherally enclose the first dielectric layers 108 over the substrate 102 respectively. In some examples, the second dielectric layers 110 and the first dielectric layers 108 are formed from different materials. For example, the second dielectric layers 110 are formed from silicon oxide. In some examples, each of the second dielectric layers 110 includes a doped portion 116, in which the doped portion 116 extends from a top of the second dielectric layer 110. In some exemplary examples, the doped portion 116 includes a dopant, such as phosphorous and boron. A height of the doped portion 116 in the second dielectric layer 110 may be different from that of the doped portion 114 in the first dielectric layer 108. In certain examples, a height of the doped portion 116 is the same as that of the doped portion 114.

As shown in FIG. 1, each of the metal gates 106 has a first critical dimension CD1 and a second critical dimension CD2, in which the first critical dimension CD1 is measured at a first elevation, and the second critical dimension CD2 is measured at a second elevation, in which the second elevation is higher than the first elevation. In some examples, the first elevation is at the same level with an elevation of a top 118 of the fin structure 104, and the second elevation is at the same level with an elevation of a top 120 of the metal gate 106. In some exemplary examples, the first critical dimension CD1 ranges from about 5 nm to about 50 nm. The second critical dimension CD2 may range from about 5 nm to about 50 nm.

For example, the metal gate 106 may have an inclined surface 124 which inclines inwardly from the top 120 of the metal gate 106 to the top 118 of the fin structure 104. In some exemplary examples, a height H1 from a bottom 122 of the doped portion 114 to the top 120 of the metal gate 106 ranges from about 5 nm to about 100 nm, and a height H2 from the top 118 of the fin structure 104 to the bottom 122 of the doped portion 114 ranges from about 20 nm to about 200 nm.

Figure 2A:
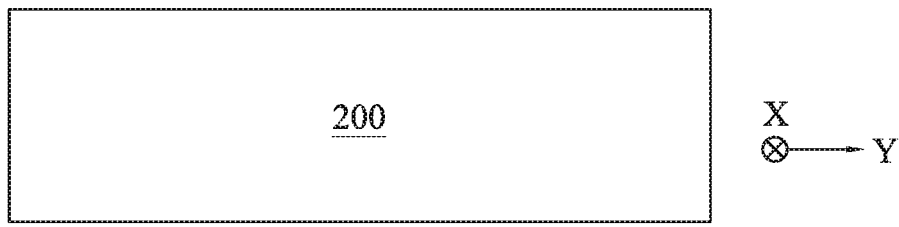
Figure 2B:
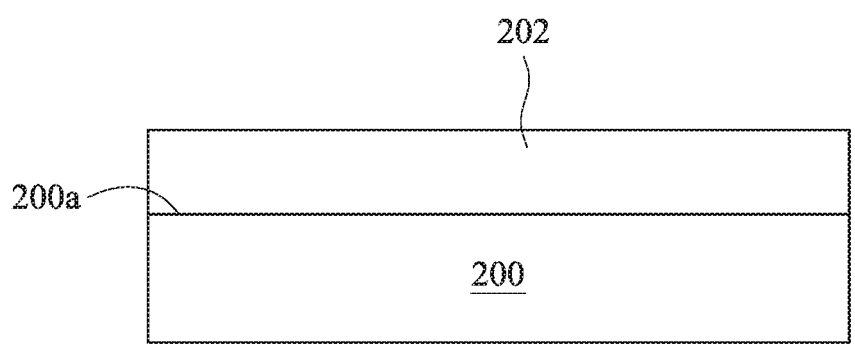
Figure 2C:
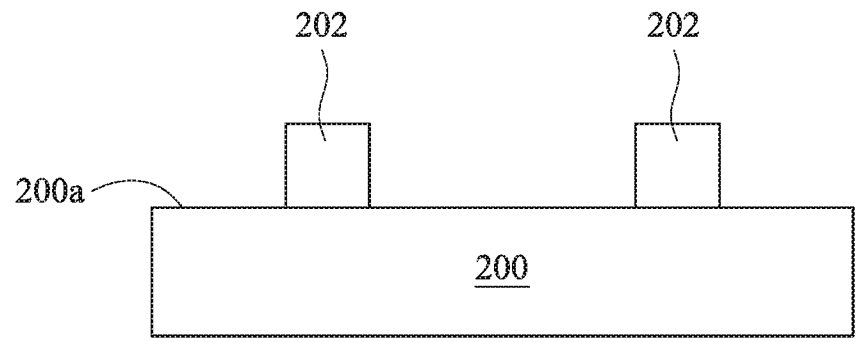
Figure 2D:
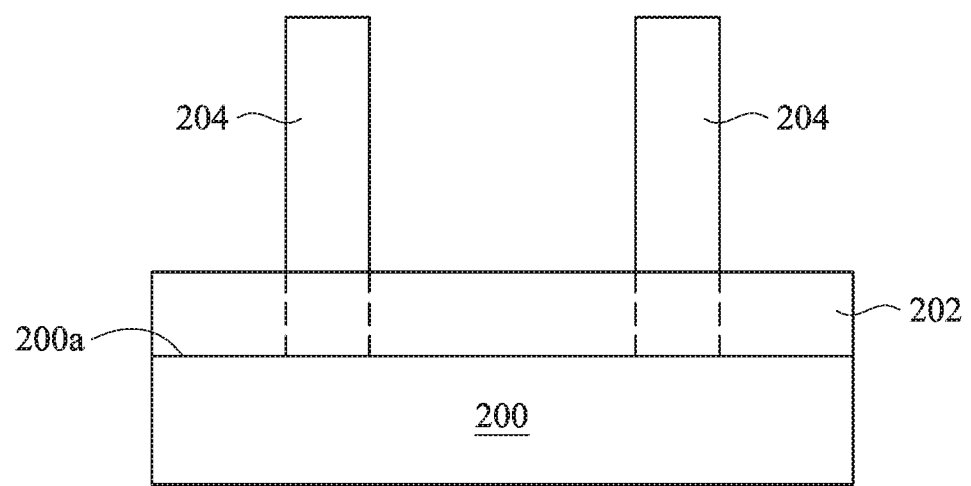
Figure 2E:
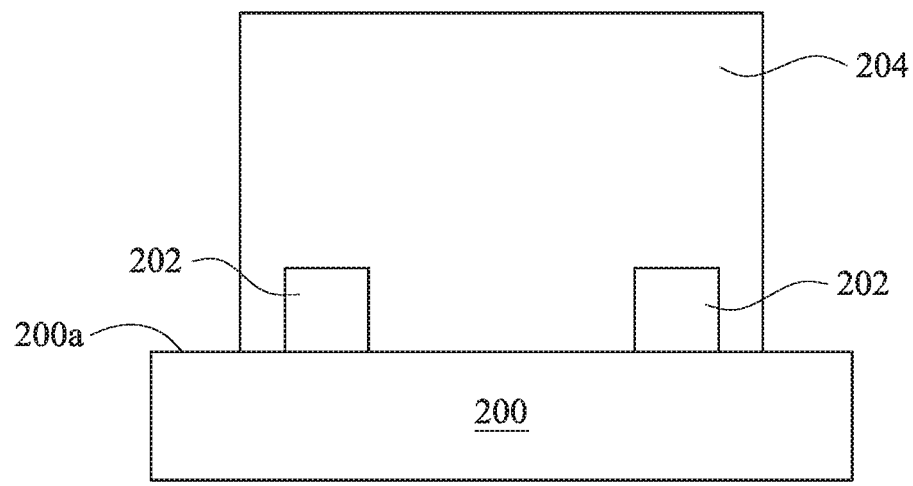

FIG. 2A through FIG. 2J are schematic front views of intermediate stages showing a method for manufacturing a semiconductor device in accordance with various embodiments, in which FIG. 2A, FIG. 2B, FIG. 2D, FIG. 2F through FIG. 2J are viewed along an X-direction shown in FIG. 2A, and FIG. 2C and FIG. 2E are viewed along a Y-direction shown in FIG. 2A. As shown in FIG. 2A, a substrate 200 is provided. In some examples, as shown in FIG. 2B and FIG. 2C, the substrate 200 may be optionally recessed to form at least one fin structure 202 on a surface 200a of the substrate 200 by using, for example, a photolithography process and an etching process. In the operation of recessing the substrate 200, a portion of the substrate 200 is removed. In some examples, as shown in FIG. 2C, two fin structures 202 are formed in the operation of recessing the substrate 200. In such examples, each of the fin structures 202 is composed of a portion of the substrate 200, such that the fin structures 202 are formed from a material the same as that of the substrate 200. The substrate 200 and the fin structures 202 may be composed of a single-crystalline semiconductor material or a compound semiconductor material. In some examples, silicon, germanium or glass may be used as a material of the substrate 200 and the fin structures 202. In some exemplary examples, the substrate 200 and the fin structures 202 are formed from silicon.

As shown in FIG. 2D and FIG. 2E, one or more dummy gates 204 are formed on a portion of the surface 200a of the substrate 200, in which each of the dummy gate 204 is formed on a portion of the fin structure 202. In some examples, the dummy gates 204 are formed by using a deposition process and an etching process. The deposition process may be a chemical vapor deposition (CVD) process or a plasma-enhanced chemical vapor deposition (PECVD) process, for example. In some exemplary examples, the dummy gates 204 are formed from polysilicon.

Figure 2F:
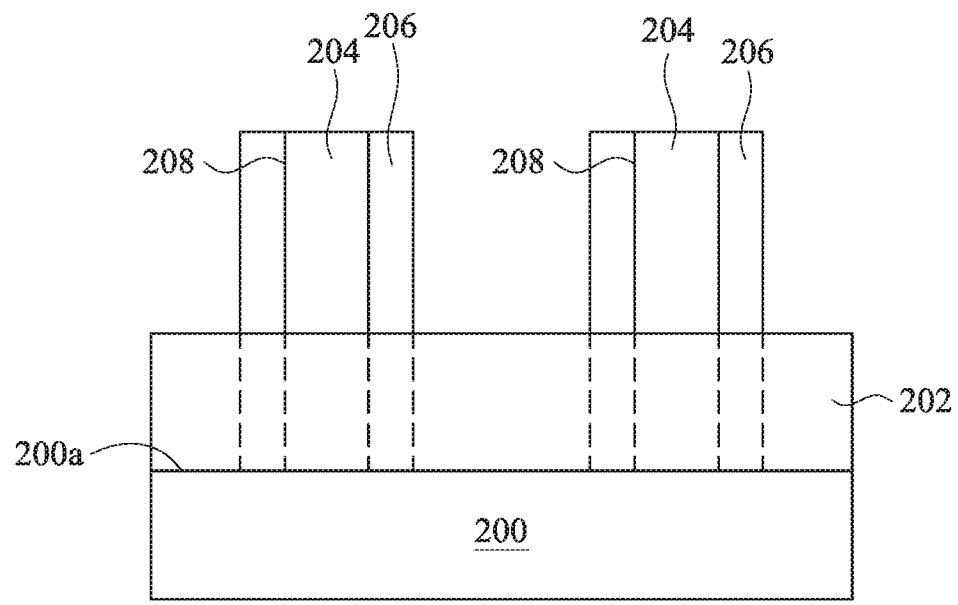

As shown in FIG. 2F, one or more first dielectric layers 206 are formed over the surface 200a of the substrate 200. An operation of forming the first dielectric layers 206 includes forming each of the first dielectric layers 206 to peripherally enclose one of the dummy gates 204. The operation of forming the first dielectric layers 206 is performed by using a deposition process, such as a chemical vapor deposition process or a plasma-enhanced chemical vapor deposition process. The first dielectric layers 206 are formed from silicon nitride or silicon oxynitride. In some examples, each of the first dielectric layers 206 is formed to have an inner side surface 208, in which the inner side surface 208 contacts the dummy gate 204. In some exemplary examples, the inner side surface 208 of each of the first dielectric layers 206 is perpendicular to the surface 200a of the substrate 200.

Figure 2G:
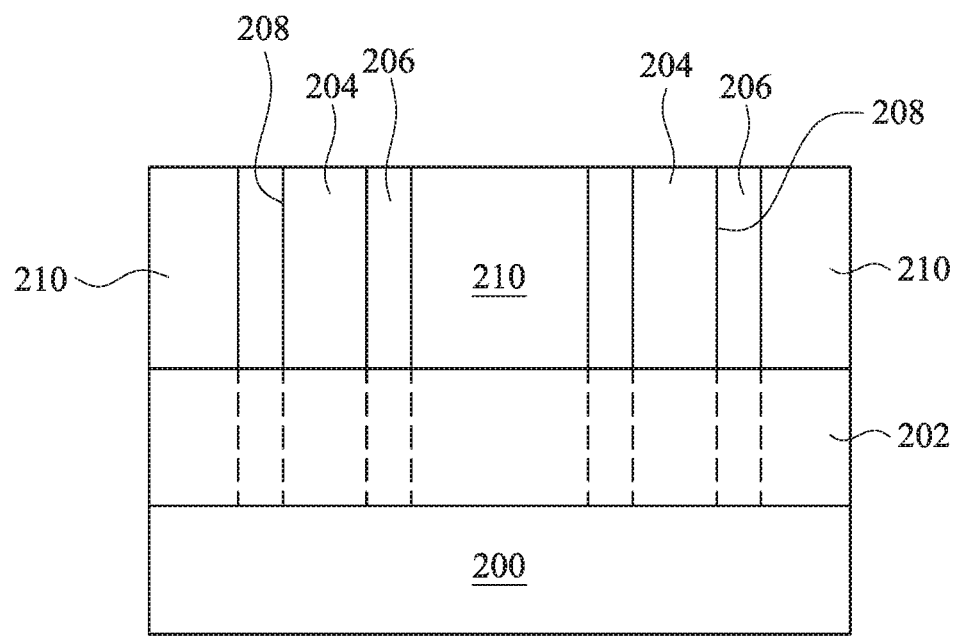

As shown in FIG. FIG. 2G, one or more second dielectric layers 210 are formed over the surface 200a of the substrate 200. An operation of forming the second dielectric layers 210 includes forming each of the second dielectric layers 210 to peripherally enclose one of the first dielectric layers 206. The operation of forming the second dielectric layers 210 is performed by using a deposition process, such as a chemical vapor deposition process or a plasma-enhanced chemical vapor deposition process. In some examples, the second dielectric layers 210 and the first dielectric layers 206 are formed from different materials. For example, the second dielectric layers 210 are formed from silicon oxide while the first dielectric layers 206 are formed from silicon nitride or silicon oxynitride.

Figure 2H:
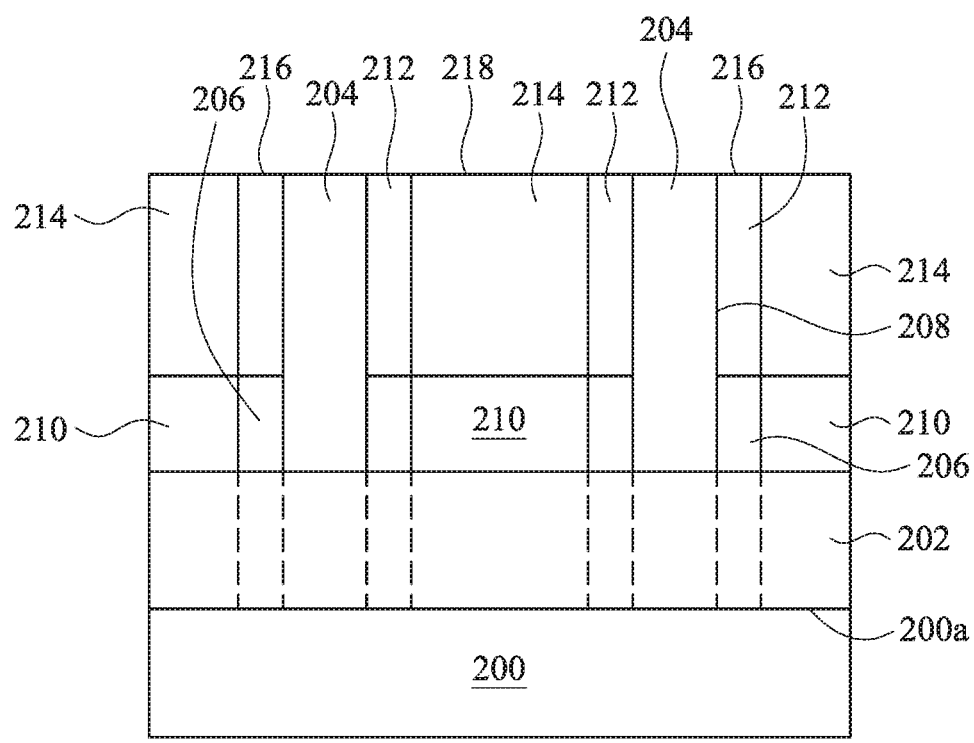

As shown in FIG. 2H, an implant operation is at least performed on the first dielectric layers 206 to form a first doped portion 212 in each of the first dielectric layers 206. The first doped portion 212 extends from a top 216 of the first dielectric layer 206. The implant operation is performed using a dopant, such as phosphorous or boron. Thus, the first doped portion 212 is formed from the material of the first dielectric layer 206 and is doped with the dopant, such that the first doped portion 212 may have an etching selectivity with respect to the first dielectric layer 206 during an operation of removing the dummy gates 204.

Referring to FIG. 2H again, the implant operation may be simultaneously performed on the second dielectric layers 210 to form a second doped portion 214 in each of the second dielectric layers 210. The second doped portion 214 extends from a top 218 of the second dielectric layer 210. The second doped portion 214 is formed from the material of the second dielectric layer 210 and is doped with the dopant used in the implant operation, such that the second doped portion 214 may have an etching selectivity with respect to the second dielectric layer 210 during the operation of removing the dummy gates 204. In such examples, the first doped portion 212 and the second doped portion 214 are doped with the same dopant. In some examples, a height of the first doped portion 212 in the first dielectric layer 206 may be different from that of the second doped portion 214 in the second dielectric layer 210. In certain examples, a height of the first doped portion 212 is the same as that of the second doped portion 214.

Figure 2I:
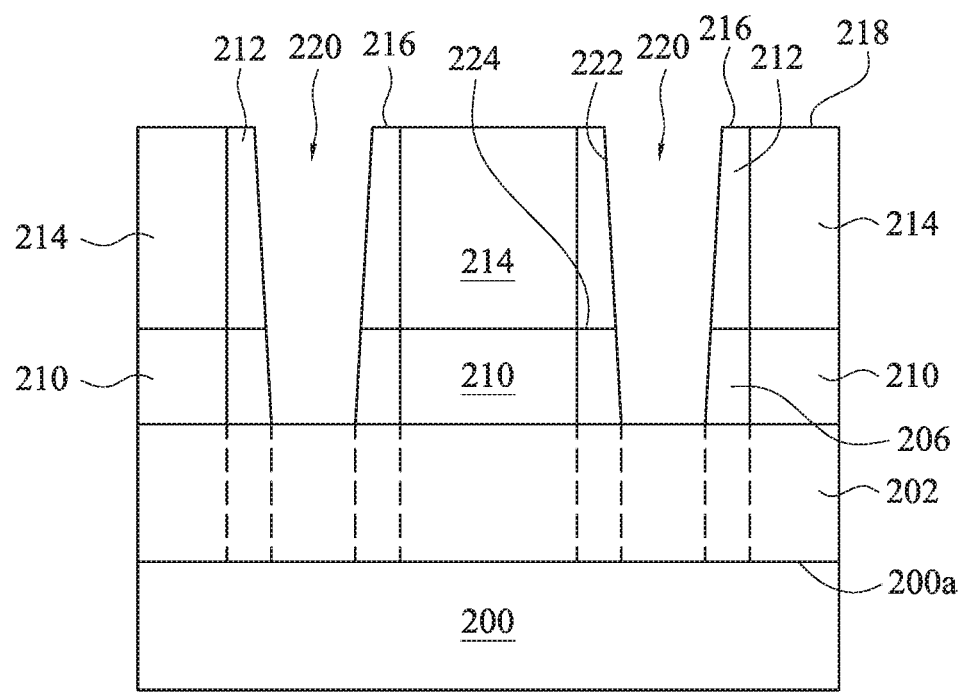

As shown in FIG. 2I, the dummy gates 204 are removed to form holes 220 in the first dielectric layers 206 respectively. In some examples, an operation of removing the dummy gates 204 is performed using a dry etching technique or a wet etching technique. The first doped portions 212 have an etching selectivity with respect to the first dielectric layers 206, and thus a portion of each first doped portion 212 is removed and the first dielectric layers 206 are hardly removed during the operation of removing the dummy gates 204. Consequently, after the operation of removing the dummy gates 204 is completed, each of the holes 220 has an inclined surface 222 which inclines inwardly from the top 216 of the first dielectric layer 206 to a bottom 224 of the first doped portion 212. As a result, each of the holes 220 is formed to have a bottom radial opening area and a top radial opening area which is greater than the bottom radial opening area.

Figure 2J:
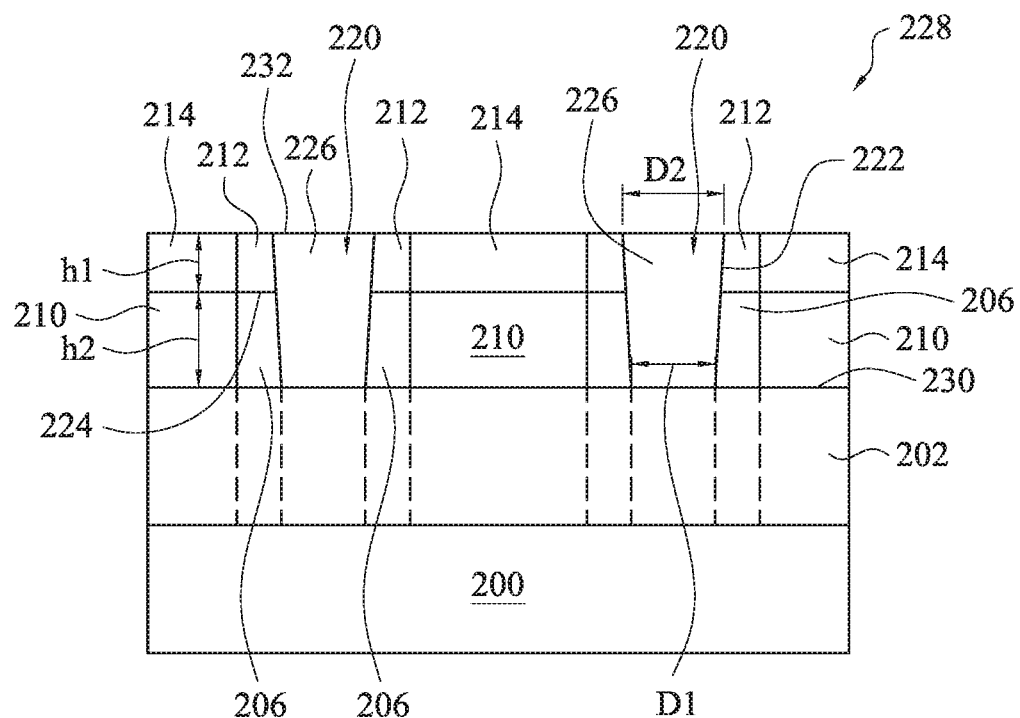

As shown in FIG. 2J, metal gates 226 are respectively formed in the holes 220 to complete a formation of a semiconductor device 228. In some examples, an operation of forming the metal gates 226 includes forming a metal layer (the metal gates 226 are portions of the metal layer) to fill the holes 220 and cover the first doped portions 212 of the first dielectric layers 206 and the second doped portions 214 of the second dielectric layers 210, and performing a polishing operation on the metal layer to remove a portion of the metal layer above the first dielectric layers 206 and the second dielectric layers 210. For example, an operation of forming the metal layer may be performed by using a deposition process, such as chemical vapor deposition process and a physical vapor deposition (PVD) process. The polishing operation may be performed by using a chemical mechanical polishing (CMP) process. In some exemplary examples, portions of the first doped portions 212 of the first dielectric layers and portions of the second doped portions 214 of the second dielectric layers 210 are polished during the polishing operation.

Referring to FIG. 2I again, because the operation of removing the dummy gates 204 simultaneously removes portions of the first doped portions 212 to enlarge an opening of each of the holes 220, the metal layer for the metal gates 226 can fill the holes 220 more easily. Thus, filling efficiency of the metal layer for the metal gates 226 is increased, thereby enhancing performance of the semiconductor device 228.

Referring to FIG. 2J again, after the polishing operation is completed, each of the holes 220 has a first critical dimension D1 and a second critical dimension D2. In some examples, the first critical dimension D1 is measured at an elevation of a top 230 of the fin structure 202, and the second critical dimension D2 is measured at an elevation of a top 232 of the hole 220, in which the second critical dimension D2 is greater than the first critical dimension D1. The first critical dimension D1 may range from about 5 nm to about 50 nm. The second critical dimension D2 may range from about 5 nm to about 50 nm. In some exemplary examples, a height h1 from the bottom 224 of the first doped portion 212 to the top 232 of the hole 220 ranges from about 5 nm to about 100 nm, and a height h2 from the top 230 of the fin structure 202 to the bottom 224 of the first doped portion 212 ranges from about 20 nm to about 200 nm.

Figure 3:
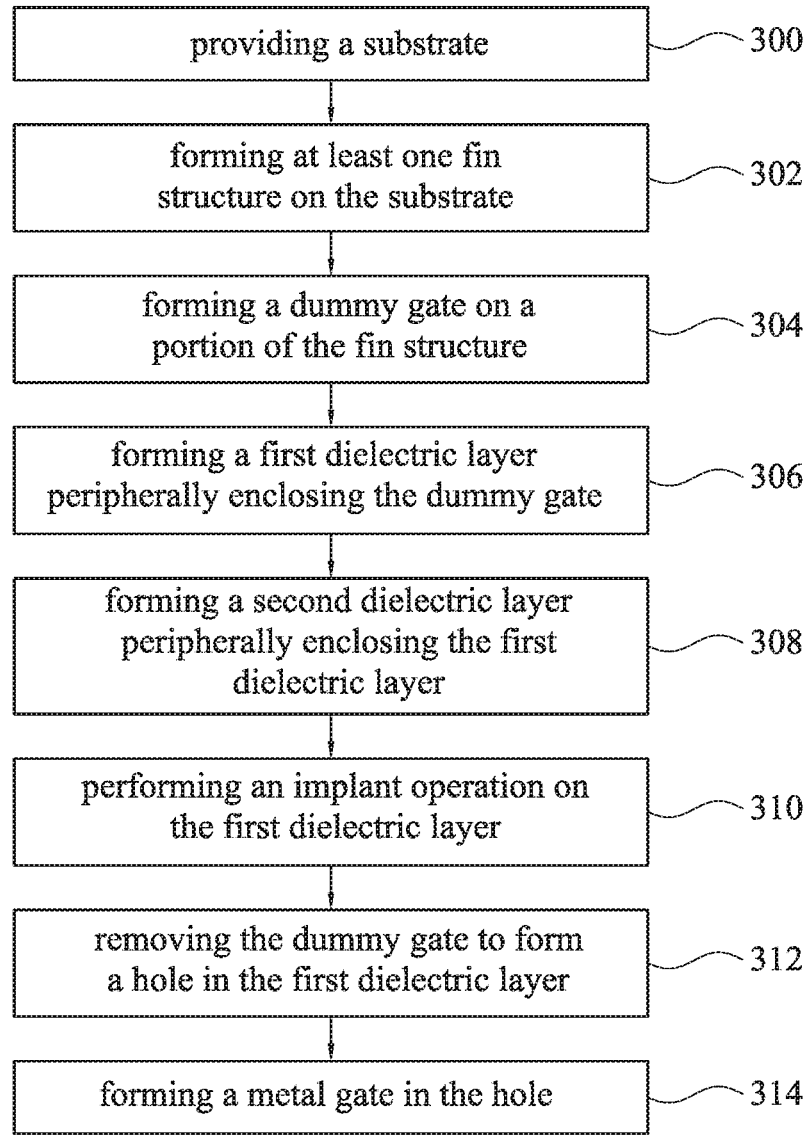
FIG. 3 is a flow chart of a method for manufacturing a semiconductor device in accordance with various embodiments.

Referring to FIG. 3 with FIG. 2A through FIG. 2J, FIG. 3 is a flow chart of a method for manufacturing a semiconductor device in accordance with various embodiments. The method begins at operation 300, where a substrate 200 is provided, as shown in FIG. 2A. In some examples, as shown in FIG. 2B and FIG. 2C, an operation 302 may be optionally performed on the substrate 200 to recess the substrate 200 to form at least one fin structure 202 on a surface 200a of the substrate 202. For example, the operation of recessing the substrate 200 may be performed by using a photolithography process and an etching process. In the operation of recessing the substrate 200, a portion of the substrate 200 is removed. In some examples, as shown in FIG. 2C, two fin structures 202 are formed in the operation of recessing the substrate 200.

In such examples, each of the fin structures 202 is composed of a portion of the substrate 200, such that the fin structures 202 are formed from a material the same as that of the substrate 200. The substrate 200 and the fin structures 202 may be composed of a single-crystalline semiconductor material or a compound semiconductor material. In some exemplary examples, the substrate 200 and the fin structures 202 are formed from silicon, germanium or glass.

At operation 304, as shown in FIG. 2D and FIG. 2E, one or more dummy gates 204 are formed on a portion of the surface 200a of the substrate 200, in which each of the dummy gate 204 is formed on a portion of the fin structure 202. In some examples, the dummy gates 204 are formed by using a deposition process and an etching process. For example, the deposition process may be a chemical vapor deposition process or a plasma-enhanced chemical vapor deposition process. In some exemplary examples, the dummy gates 204 are formed from polysilicon.

At operation 306, as shown in FIG. 2F, one or more first dielectric layers 206 are formed over the surface 200a of the substrate 200. In an operation of forming the first dielectric layers 206, each of the first dielectric layers 206 is formed to peripherally enclose one of the dummy gates 204. The operation of forming the first dielectric layers 206 is performed by using a deposition process, such as a chemical vapor deposition process or a plasma-enhanced chemical vapor deposition process. In some examples, each of the first dielectric layers 206 is formed to have an inner side surface 208, in which the inner side surface 208 contacts with the dummy gate 204. In some exemplary examples, the inner side surface 208 of each of the first dielectric layers 206 is perpendicular to the surface 200a of the substrate 200.

At operation 308, as shown in FIG. 2G, one or more second dielectric layers 210 are formed over the surface 200a of the substrate 200. In an operation of forming the second dielectric layers 210, each of the second dielectric layers 210 is formed to peripherally enclose one of the first dielectric layers 206. The operation of forming the second dielectric layers 210 is performed by using a deposition process, such as a chemical vapor deposition process or a plasma-enhanced chemical vapor deposition process. In some examples, the second dielectric layers 210 and the first dielectric layers 206 are formed from different materials. For example, the second dielectric layers 210 are formed from silicon oxide while the first dielectric layers 206 are formed from silicon nitride or silicon oxynitride.

At operation 310, as shown in FIG. 2H, an implant operation is at least performed on the first dielectric layers 206 to form a first doped portion 212 in each of the first dielectric layers 206. The first doped portion 212 extends from a top 216 of the first dielectric layer 206. The implant operation is performed using a dopant, such as phosphorous or boron. Thus, the first doped portion 212 is formed from the material of the first dielectric layer 206 and is doped with the dopant, and the first doped portion 212 may have an etching selectivity with respect to the first dielectric layer 206 during the operation of removing the dummy gates 204.

Referring to FIG. 2H again, the implant operation may be simultaneously performed on the second dielectric layers 210 to form a second doped portion 214 in each of the second dielectric layers 210. The second doped portion 214 extends from a top 218 of the second dielectric layer 210. The second doped portion 214 is formed from the material of the second dielectric layer 210 and is doped with the dopant used in the implant operation, and the second doped portion 214 may have an etching selectivity with respect to the second dielectric layer 210 during the operation of removing the dummy gates 204. In such examples, the first doped portion 212 and the second doped portion 214 are doped with the same dopant. In some examples, a height of the first doped portion 212 in the first dielectric layer 206 may be different from that of the second doped portion 214 in the second dielectric layer 210. In certain examples, a height of the first doped portion 212 is the same as that of the second doped portion 214.

At operation 312, as shown in FIG. 2I, the dummy gates 204 are removed to form holes 220 in the first dielectric layers 206 respectively. In some examples, an operation of removing the dummy gates 204 is performed using a dry etching technique or a wet etching technique. The first doped portions 212 have an etching selectivity with respect to the first dielectric layers 206 during the operation of removing the dummy gates 204, and thus a portion of each first doped portion 212 is removed and the first dielectric layers 206 are hardly removed during the operation of removing the dummy gates 204. After the operation of removing the dummy gates 204 is completed, each of the holes 220 has an inclined surface 222 which inclines inwardly from the top 216 of the first dielectric layer 206 to a bottom 224 of the first doped portion 212. Thus, each of the holes 220 is formed to have a bottom radial opening area and a top radial opening area which is greater than the bottom radial opening area.

At operation 314, as shown in FIG. 2J, metal gates 226 are respectively formed in the holes 220 to complete a formation of a semiconductor device 228. In some examples, an operation of forming the metal gates 226 includes forming a metal layer (the metal gates 226 are portions of the metal layer) to fill the holes 220 and cover the first doped portions 212 of the first dielectric layers 206 and the second doped portions 214 of the second dielectric layers 210, and performing a polishing operation on the metal layer to remove a portion of the metal layer above the first dielectric layers 206 and the second dielectric layers 210. For example, an operation of forming the metal layer may be performed by using a deposition process, such as chemical vapor deposition process and a physical vapor deposition process. The polishing operation may be performed by using a chemical mechanical polishing process. In some exemplary examples, portions of the first doped portions 212 of the first dielectric layers and portions of the second doped portions 214 of the second dielectric layers 210 are polished during the polishing operation.

Referring to FIG. 2I again, the operation of removing the dummy gates 204 simultaneously removes portions of the first doped portions 212, such that an opening of each of the holes 220 is enlarged, and the metal layer for the metal gates 226 can fill the holes 220 more easily. Thus, filling efficiency of the metal layer for the metal gates 226 is increased, thereby enhancing performance of the semiconductor device 228.

Referring to FIG. 2J again, after the polishing operation is completed, each of the holes 220 is formed to have a first critical dimension D1 and a second critical dimension D2. In some examples, the first critical dimension D1 is measured at an elevation of a top 230 of the fin structure 202, and the second critical dimension D2 is measured at an elevation of a top 232 of the hole 220, in which the second critical dimension D2 is greater than the first critical dimension D1. The first critical dimension D1 may range from about 5 nm to about 50 nm. The second critical dimension D2 may range from about 5 nm to about 50 nm. In some exemplary examples, a height h1 from the bottom 224 of the first doped portion 212 to the top 232 of the hole 220 ranges from about 5 nm to about 100 nm, and a height h2 from the top 230 of the fin structure 202 to the bottom 224 of the first doped portion 212 ranges from about 20 nm to about 200 nm.

In accordance with an embodiment, the present disclosure discloses a method for manufacturing a semiconductor device. In this method, a substrate is provided. A dummy gate is formed on the substrate. A first dielectric layer is formed to peripherally enclose the dummy gate over the substrate. A second dielectric layer is formed to peripherally enclose the first dielectric layer over the substrate, in which the second dielectric layer and the first dielectric layer are formed from different materials. An implant operation is performed on the first dielectric layer to form a first doped portion in the first dielectric layer. The dummy gate is removed to form a hole in the first dielectric layer, in which an operation of removing the dummy gate includes removing a portion of the first doped portion to form the hole having a bottom radial opening area and a top radial opening area which is greater than the bottom radial opening area. A metal gate is formed in the hole.

In accordance with another embodiment, the present disclosure discloses a method for manufacturing a semiconductor device. In this method, a substrate is provided. At least one fin structure is formed on the substrate. A dummy gate is formed on a portion of the at least one fin structure on the substrate. A first dielectric layer is formed to peripherally enclose the dummy gate over the substrate. A second dielectric layer is formed to peripherally enclose the first dielectric layer over the substrate, in which the second dielectric layer and the first dielectric layer are formed from different materials. An implant operation is performed on the first dielectric layer to form a doped portion in the first dielectric layer. The dummy gate is removed to form a hole in the first dielectric layer, in which an operation of removing the dummy gate removes a portion of the doped portion. A metal gate is formed in the hole. After the metal gate is formed, the hole has a first critical dimension and a second critical dimension which is greater than the first critical dimension, in which the first critical dimension is measured at an elevation of a top of the at least one fin structure, and the second critical dimension is measured at an elevation of a top of the hole.

In accordance with yet another embodiment, the present disclosure discloses a semiconductor device. The semiconductor device includes a substrate, at least one fin structure, a metal gate, a first dielectric layer and a second dielectric layer. The at least one fin structure is disposed on the substrate. The metal gate is disposed on a portion of the at least one fin structure on the substrate. The metal gate has a first critical dimension and a second critical dimension which is greater than the first critical dimension, in which the first critical dimension is measured at a first elevation, and the second critical dimension is measured at a second elevation which is higher than the first elevation. The first dielectric layer peripherally encloses the metal gate over the substrate, in which the first dielectric layer comprises a doped portion. The second dielectric layer peripherally encloses the first dielectric layer over the substrate, in which the second dielectric layer and the first dielectric layer are formed from different materials.

One general aspect of embodiments described herein includes a semiconductor device, including: a substrate; a metal gate on a portion of the substrate, where the metal gate has a first width and a second width which is greater than the first width, where the first width is measured at a first height above the substrate, and the second width is measured at a second height above the substrate which is higher than the first height; a first dielectric layer, where the first dielectric layer includes a doped portion surrounding an upper portion of the metal gate and an undoped portion surrounding a lower portion of the metal gate; and a second dielectric layer surrounding the first dielectric layer.

Another general aspect of embodiments described herein includes a semiconductor device, including: a substrate; a metal gate over the substrate, the metal gate having a lower sidewall proximate to the substrate and an upper sidewall distal from the substrate; a first dielectric layer over the substrate, the first dielectric layer including a first doped region peripherally surrounding the upper sidewall and a first undoped region peripherally surrounding the lower sidewall; and a second dielectric layer, different than the first dielectric layer, the second dielectric layer including a second doped region peripherally surrounding the first doped region, the second dielectric layer further including a second undoped region peripherally surrounding the first undoped region.

Yet another general aspect of embodiments described herein includes a method including: lining sidewalls of a dummy structure with a first dielectric layer; forming a modified region of the first dielectric layer by modifying an etch selectivity of an upper portion of the first dielectric layer relative to a lower portion of the first dielectric layer; removing the dummy structure using an etch process, where the etch process etches the modified region at a higher rate relative to the lower portion of the first dielectric layer; and forming a metal gate in a region left by removing the dummy structure, where the metal gate has a first width in an upper region bounded by the modified region and a second width in a lower region bounded by the lower portion of the first dielectric layer, the first width being greater than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a metal gate on a portion of the substrate, wherein the metal gate has sidewalls and the metal gate has a first width and a second width which is greater than the first width, wherein the first width is measured at a first height above the substrate, and the second width is measured at a second height above the substrate which is higher than the first height;
   a first dielectric layer extending from a topmost portion of the metal gate sidewalls to a bottommost portion of the metal gate sidewalls, wherein the first dielectric layer comprises a doped portion surrounding an upper portion of the metal gate and an undoped portion surrounding a lower portion of the metal gate, and wherein the doped portion has greater etch selectivity to a predetermined etchant than does the undoped portion; and
   a second dielectric layer surrounding the first dielectric layer.

2. The semiconductor device of claim 1, wherein the first dielectric layer includes at least one of silicon nitride and silicon oxynitride, and the second dielectric layer includes silicon oxide.

3. The semiconductor device of claim 1, wherein the doped portion is doped with phosphorous or boron.

4. The semiconductor device of claim 1, wherein the second dielectric layer includes a doped region overlying an undoped region.

5. The semiconductor device of claim 1, wherein the metal gate extends over a fin structure.

6. The semiconductor device of claim 5, wherein the first height above the substrate is at a top of the fin structure and the height above the substrate is at second critical dimension is measured at a top of the metal gate.

7. The semiconductor device of claim 5, wherein a height from a bottom of the doped portion to a top of the metal gate from 5 nm to 100 nm, and a height from the top of the fin structure to a bottom of the doped portion ranges from 20 nm to 200 nm.

8. A semiconductor device, comprising:
   a substrate;
   a metal gate over the substrate, the metal gate having a lower sidewall proximate to the substrate and an upper sidewall distal from the substrate, wherein the upper sidewall has a first slope and the lower sidewall has a second slope, the first slope being lesser than the second slope;
   a first dielectric layer over the substrate, the first dielectric layer including a first doped region peripherally surrounding the upper sidewall and a first undoped region peripherally surrounding the lower sidewall, wherein the first doped region is more susceptible to etch removal than is the first undoped region when both the first doped region and the second undoped region are exposed to a same etch process; and
   a second dielectric layer, different than the first dielectric layer, the second dielectric layer including a second doped region peripherally surrounding the first doped region, the second dielectric layer further including a second undoped region peripherally surrounding the first undoped region.

9. The semiconductor device of claim 8, wherein the lower sidewall of the metal gate extends along a sidewall of a semiconductor fin structure.

10. The semiconductor device of claim 8, wherein the first dielectric layer is silicon nitride or silicon oxynitride, and the second dielectric layer is silicon oxide.

11. The semiconductor device of claim 8, wherein an interface between the first doped region and the first undoped region is level with an interface between the second doped region and the second undoped region.

12. The semiconductor device of claim 8, wherein the first doped region is doped with phosphorous or boron.

13. The semiconductor device of claim 8, wherein the first doped region peripherally surrounding the upper sidewall has a higher etch selectivity when exposed to an etchant process relative to the first undoped region peripherally surrounding the lower sidewall when exposed to the etchant process.

14. The semiconductor device of claim 8, wherein the first doped region and the second doped region are doped with a same dopant.

15. A semiconductor device, comprising:
a substrate;
a metal gate over the substrate, the metal gate having a lower sidewall proximate to the substrate and an upper sidewall distal from the substrate;
a first dielectric layer comprising a first doped region peripherally surrounding the upper sidewall of the metal gate and a first undoped region peripherally surrounding the lower sidewall of the metal gate, wherein the first doped region has adjacent the upper sidewall a first slope and the first undoped region has adjacent the lower sidewall a second slop and wherein the first slope is lesser than the second slope, and further wherein the first doped region is more susceptible to etch removal than is the first undoped region when both the first doped region and the second undoped region are exposed to a same etch process; and
a second dielectric layer peripherally surrounding the first dielectric layer.

16. The semiconductor device of claim 15, wherein the second dielectric layer is different than the first dielectric layer and includes a second doped region peripherally surrounding the first doped region and further includes a second undoped region peripherally surrounding the first undoped region.

17. The semiconductor device of claim 15, wherein the metal gate has a first width and a second width which is greater than the first width, wherein the first width is measured at a first height above the substrate, and the second width is measured at a second height above the substrate which is higher than the first height.

18. The semiconductor device of claim 15, wherein the lower sidewall of the metal gate extends along a sidewall of a semiconductor fin structure.

19. The semiconductor device of claim 15, wherein the first doped region is doped with phosphorous or boron.

20. The semiconductor device of claim 15, wherein the first doped region peripherally surrounding the upper sidewall has a higher etch selectivity when exposed to an etchant process relative to the first undoped region peripherally surrounding the lower sidewall when exposed to the etchant process.

\* \* \* \* \*